(12) United States Patent
Takeshima et al.

(10) Patent No.: US 8,896,092 B2
(45) Date of Patent: Nov. 25, 2014

(54) ANTI-FUSE ELEMENT

(75) Inventors: Yutaka Takeshima, Nagaokakyo (JP);
Toshiyuki Nakaiso, Nagaokakyo (JP);
Shinsuke Tani, Nagaokakyo (JP)

(73) Assignee: Murata Manufacturing Co., Ltd.,
Nagaokakyo-Shi, Kyoto-fu (JP)

( * ) Notice: Subject to any disclaimer, the term of this patent is extended or adjusted under 35 U.S.C. 154(b) by 328 days.

(21) Appl. No.: 13/344,662

(22) Filed: Jan. 6, 2012

(65) Prior Publication Data
US 2012/0104545 A1    May 3, 2012

Related U.S. Application Data

(63) Continuation of application No. PCT/JP2010/061640, filed on Jul. 8, 2010.

(30) Foreign Application Priority Data

Jul. 9, 2009    (JP) ................................. 2009-162445

(51) Int. Cl.
*H01L 23/52*    (2006.01)
*H01L 23/525*   (2006.01)
*H01L 27/02*    (2006.01)
*H01L 23/62*    (2006.01)
*H01L 25/16*    (2006.01)

(52) U.S. Cl.
CPC ........ *H01L 23/5252* (2013.01); *H01L 27/0248* (2013.01); *H01L 23/62* (2013.01); *H01L 25/167* (2013.01); *H01L 2924/0002* (2013.01)
USPC .................................. 257/530; 257/E23.147

(58) Field of Classification Search
CPC ...................................................... H01L 23/525
USPC ............................................ 257/530, E23.147
See application file for complete search history.

(56) References Cited

U.S. PATENT DOCUMENTS

| 4,823,181 | A | * | 4/1989 | Mohsen et al. | ............... 257/530 |
| 4,899,205 | A | * | 2/1990 | Hamdy et al. | ................. 257/530 |
| 4,914,055 | A | * | 4/1990 | Gordon et al. | ................. 438/600 |
| 4,943,538 | A | * | 7/1990 | Mohsen et al. | ............... 438/215 |
| 5,120,679 | A | * | 6/1992 | Boardman et al. | ............ 438/600 |
| 5,134,457 | A | * | 7/1992 | Hamdy et al. | ................. 257/530 |

(Continued)

FOREIGN PATENT DOCUMENTS

| JP | 10-178098 A | 6/1998 |
| JP | 2000-011684 A | 1/2000 |

(Continued)

OTHER PUBLICATIONS

PCT/JP2010/061640 Written Opinion dated Sep. 29, 2010.

(Continued)

*Primary Examiner* — Caleb Henry
(74) *Attorney, Agent, or Firm* — Dickstein Shapiro LLP

(57) ABSTRACT

An anti-fuse element that includes a capacitance unit having an insulation layer and at least a pair of electrode layers formed on upper and lower surfaces of the insulation layer. The capacitance unit has a protection function against electrostatic discharge. Because the capacitance unit has a protection function against electrostatic discharge, an anti-fuse element can be provided which is less likely to cause insulation breakdown due to electrostatic discharge at the time of, for example, mounting a component.

16 Claims, 6 Drawing Sheets

(56) References Cited

U.S. PATENT DOCUMENTS

| | | | | |
|---|---|---|---|---|
| 5,266,829 A * | 11/1993 | Hamdy et al. | | 257/530 |
| 5,328,865 A * | 7/1994 | Boardman et al. | | 438/600 |
| 5,329,153 A * | 7/1994 | Dixit | | 257/530 |
| 5,412,244 A * | 5/1995 | Hamdy et al. | | 257/530 |
| 5,444,290 A * | 8/1995 | Paz De Araujo et al. | | 257/530 |
| 5,463,244 A * | 10/1995 | De Araujo et al. | | 257/530 |
| 5,469,379 A * | 11/1995 | Levy | | 365/96 |
| 5,572,061 A * | 11/1996 | Chen et al. | | 257/530 |
| 5,572,409 A * | 11/1996 | Nathan et al. | | 361/806 |
| 5,581,111 A * | 12/1996 | Chen | | 257/530 |
| 5,625,219 A * | 4/1997 | Takagi | | 257/530 |
| 5,629,227 A * | 5/1997 | Chen | | 438/600 |
| 5,679,974 A * | 10/1997 | Shinriki et al. | | 257/530 |
| 5,786,268 A * | 7/1998 | Gordon et al. | | 438/600 |
| 5,789,795 A * | 8/1998 | Sanchez et al. | | 257/530 |
| 5,913,137 A * | 6/1999 | Chen | | 438/600 |
| 5,937,281 A * | 8/1999 | Wu | | 438/131 |
| 5,962,910 A * | 10/1999 | Hawley et al. | | 257/530 |
| 5,989,943 A * | 11/1999 | Whitten et al. | | 438/131 |
| 6,001,693 A * | 12/1999 | Yeouchung et al. | | 438/281 |
| 6,025,226 A * | 2/2000 | Gambino et al. | | 438/244 |
| 6,081,021 A * | 6/2000 | Gambino et al. | | 257/530 |
| 6,097,077 A * | 8/2000 | Gordon et al. | | 257/530 |
| 6,111,302 A * | 8/2000 | Zhang et al. | | 257/530 |
| 6,150,199 A * | 11/2000 | Whitten et al. | | 438/128 |
| 6,156,588 A * | 12/2000 | Sanchez et al. | | 438/131 |
| 6,163,488 A | 12/2000 | Tanizaki et al. | | |
| 6,166,423 A * | 12/2000 | Gambino et al. | | 257/532 |
| 6,326,218 B1 * | 12/2001 | Yunogami et al. | | 438/3 |
| 6,603,187 B1 * | 8/2003 | Zhang et al. | | 257/530 |
| 6,630,724 B1 * | 10/2003 | Marr | | 257/530 |
| 6,730,573 B1 * | 5/2004 | Ng et al. | | 438/381 |
| 6,844,609 B2 * | 1/2005 | Motsiff et al. | | 257/530 |
| 6,979,879 B1 * | 12/2005 | Yindeepol et al. | | 257/530 |
| 6,979,880 B2 * | 12/2005 | Bhattacharyya et al. | | 257/530 |
| 7,358,590 B2 * | 4/2008 | Yukawa et al. | | 257/530 |
| 7,675,139 B2 * | 3/2010 | Nomura et al. | | 257/532 |
| 7,723,820 B2 * | 5/2010 | Kim et al. | | 257/530 |
| 7,880,266 B2 * | 2/2011 | Park et al. | | 257/530 |
| 7,982,285 B2 * | 7/2011 | Park et al. | | 257/530 |
| 7,994,607 B2 * | 8/2011 | Tokunaga et al. | | 257/530 |
| 8,164,125 B2 * | 4/2012 | Banerjee et al. | | 257/288 |
| 2001/0029052 A1 * | 10/2001 | Suenaga et al. | | 438/3 |
| 2001/0051414 A1 * | 12/2001 | Kanaya et al. | | 438/386 |
| 2002/0000590 A1 * | 1/2002 | Yamamichi | | 257/296 |
| 2002/0050625 A1 * | 5/2002 | Cutter et al. | | 257/530 |
| 2002/0075743 A1 | 6/2002 | Ooishi et al. | | |
| 2002/0179954 A1 * | 12/2002 | Joo et al. | | 257/303 |
| 2004/0087098 A1 * | 5/2004 | Ng et al. | | 438/381 |
| 2004/0130849 A1 * | 7/2004 | Kurihara et al. | | 361/311 |
| 2006/0166431 A1 | 7/2006 | Thakur | | |
| 2006/0250749 A1 * | 11/2006 | Kurihara et al. | | 361/306.3 |
| 2007/0216029 A1 * | 9/2007 | Tsai | | 257/758 |
| 2007/0220725 A1 * | 9/2007 | Borland | | 29/25.42 |
| 2007/0279812 A1 | 12/2007 | Sasaki | | |
| 2008/0145996 A1 * | 6/2008 | Nomura et al. | | 438/396 |
| 2008/0164563 A1 * | 7/2008 | Nomura et al. | | 257/532 |
| 2008/0224140 A1 * | 9/2008 | Tokunaga et al. | | 257/57 |
| 2009/0294903 A1 * | 12/2009 | Shih et al. | | 257/530 |
| 2010/0118468 A1 * | 5/2010 | Nomura et al. | | 361/313 |
| 2010/0149898 A1 * | 6/2010 | Tak et al. | | 365/225.7 |
| 2010/0193789 A1 * | 8/2010 | Tokunaga | | 257/57 |
| 2011/0254122 A1 * | 10/2011 | Noda et al. | | 257/530 |
| 2011/0309472 A1 * | 12/2011 | Nakaiso et al. | | 257/530 |
| 2012/0112313 A1 * | 5/2012 | Tani et al. | | 257/530 |
| 2012/0119328 A1 * | 5/2012 | Nakaiso | | 257/532 |
| 2012/0126365 A1 * | 5/2012 | Tani et al. | | 257/530 |
| 2012/0199885 A1 * | 8/2012 | Banerjee et al. | | 257/262 |
| 2013/0088811 A1 * | 4/2013 | Takeshima et al. | | 361/311 |

FOREIGN PATENT DOCUMENTS

| | | |
|---|---|---|
| JP | 2000-133717 A | 5/2000 |
| JP | 2006-339312 A | 12/2006 |
| JP | 2007-200577 A | 8/2007 |
| JP | 2007-324355 A | 12/2007 |

OTHER PUBLICATIONS

PCT/JP2010/061640 Search Report dated Sep. 29, 2010.

* cited by examiner

FIG. 7 – PRIOR ART
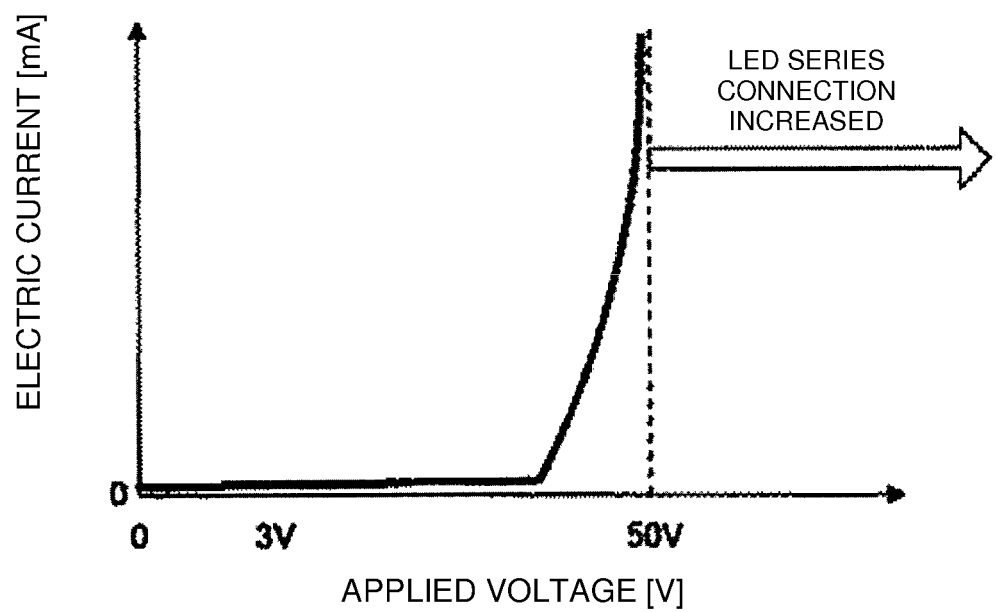

ANTI-FUSE ELEMENT

CROSS REFERENCE TO RELATED APPLICATIONS

The present application is a continuation of International application No. PCT/JP2010/061640, filed Jul. 8, 2010, which claims priority to Japanese Patent Application No. 2009-162445, filed Jul. 9, 2009, the entire contents of each of which are incorporated herein by reference.

FIELD OF THE INVENTION

The present invention relates to an anti-fuse element.

BACKGROUND OF THE INVENTION

Common fuses are blown out at a predetermined voltage or more to interrupt current. On the contrary, anti-fuse elements have been proposed which are short-circuited at a predetermined voltage or more to cause a current to flow.

For example, Patent Document 1 discloses a structure as shown in a cross-sectional view of FIG. 5. An insulation layer 108 is made of an insulation material (for example, an $SiO_2$), and the insulation layer 108 is formed continuously so as to step over a gap 103 between wiring patterns 102a, 102t in contact with the both wiring patters 102s, 102t formed on a substrate 101. Lead terminals 104, 105 of an LED (light-emitting diode) 106 are connected to the wiring patterns 102s, 102t with the use of solders 104a, 105a.

In a normal state, a current flows in the forward direction of the LED 106. For example, a current flows from one wiring pattern 102s, through the solder 105a, the lead terminal 105, the LED 106, the lead terminal 104, and the solder 104a, to the other wiring pattern 102t.

However, in an open state (defective open) with no current flowing through the LED 106 due to a defective, a failure, or the like of the LED 106, the voltage applied between the wiring patterns 102s and 102t causes the insulation layer 108 to undergo insulation breakdown, and a current flows from one wiring pattern 102s through the insulation layer 108 to the other wiring pattern 102t.

The anti-fuse element which has this configuration is used so that even if some of LEDs 111A, 111B, . . . , 111n connected in series with each other break down, the other LEDs are kept lighting-up, for example, as shown in the electrical circuit diagram of FIG. 6. In this case, anti-fuse elements 112A, 112B, . . . 112n are used in parallel connection with each of LEDs 111A, 111B, . . . , 111n connected in series with each other. In the case of defective open with no current flowing through some LEDs (for example, 111A), while the anti-fuse elements (for example, 112A) connected in parallel with the LEDs are short-circuited, a current flows around the anti-fuse elements (for example, 112A) to cause a current to flow through the other LEDs, and the other LEDs thus continue to light up.

Assuming that n LEDs are connected in series with each other and that the voltage value of the voltage drop in the forward direction of the LEDs is denoted by $V_f$, when the LED is brought into defective open, a voltage of approximately $V_f \times n$ is applied across the n LEDs connected in series with each other to cause the anti-fuse element to undergo insulation breakdown to be short-circuited, and thereby cause the other LEDs to light up.

FIG. 7 is a graph showing a relationship between the breakdown voltage of an anti-fuse element and a current through the anti-fuse element. In the conventional anti-fuse element as in the case of FIG. 7, insulation breakdown is started when the voltage (the applied voltage in FIG. 7) applied to the anti-fuse element is greater than the breakdown voltage (50 V).

Patent Document 1: Japanese Patent Application Laid-Open No. 2007-324355

SUMMARY OF THE INVENTION

As described above, when the LED is open, a voltage is applied to the anti-fuse element to short-circuit the anti-fuse element. Therefore, it is not preferable to cause short circuit at voltages other than the voltage in the case of the open LED. However, when the anti-fuse element is connected in parallel with the LED, there is a possibility that, static electricity at the time of, for example, mounting will cause the anti-fuse element to undergo insulation breakdown. The anti-fuse element requires measures taken against this electrostatic discharge (ESD). In general, electrostatic discharge means that a charged conductive object is brought into contact or closer to cause charge transfer, thereby causing a high pulsed current to flow.

An object of the present invention is, in view of the prior art described above, to provide an anti-fuse element which is less likely to cause insulation breakdown due to electrostatic discharge.

An anti-fuse element according to the present invention having a capacitance unit including an insulation layer and at least a pair of electrode layers formed on upper and lower surfaces of the insulation layer, is characterized in that the capacitance unit has a protection function against electrostatic discharge.

In the present invention, the capacitance unit has a protection function against electrostatic discharge. More specifically, the anti-fuse element with a certain amount of capacitance collects electrification charge into the capacitance unit, thereby preventing a high current leading to insulation breakdown from flowing. Therefore, an anti-fuse element can be provided which is less likely to cause insulation breakdown due to electrostatic discharge at the time of, for example, mounting a component.

In addition, the anti-fuse element according to the present invention preferably has a withstand voltage of 100 V to 250 V in an electrostatic breakdown test for a machine model of the capacitance unit.

In this case, even when a high voltage is applied due to static electricity and the like, the achievement of an anti-fuse element is made possible, which is less likely to cause insulation breakdown.

In addition, in the anti-fuse element according to the present invention, the capacitance unit preferably has a capacitance of 1 nF to 100 nF. Furthermore, in the anti-fuse element according to the present invention, the capacitance unit preferably has a capacitance of 4.2 nF to 15 nF. In addition, in the anti-fuse element according to the present invention, the insulation layer has a dielectric constant of 100 to 1000.

In addition, in the anti-fuse element according to the present invention, preferably, during the application of a voltage not less than a breakdown voltage of the insulation layer, at least the pair of electrode layers are melted, and at least the pair of electrode layers are electrically connected by welding to each other.

In this case, the pair of electrode layers are easily short-circuited by applying a voltage not less than the breakdown voltage of the insulation layer. In addition, the resistance is also low in the case of applying a high current, and the resistance value is also stable after the short circuit.

In addition, in the anti-fuse element according to the present invention, preferably, during the application of a voltage not less than the breakdown voltage of the insulation layer, at least the pair of electrode layers are melted to divide the insulation layer, and weld at least the pair of electrode layers with each other in a manner that wraps the insulation layer.

In this case, the pair of electrode layers are tightly integrated with each other, thereby allowing the achievement of a low-resistance stable conducting state with certainty.

In addition, in the anti-fuse element according to the present invention, preferably, the insulation layer has a material of (Ba, Sr) $TiO_3$, and at least the pair of electrode layers have a material of a metal or an alloy thereof including at least one element selected from the group consisting of gold, silver, platinum, palladium, rhodium, iridium, ruthenium, and osmium.

In this case, even when a high voltage is applied due to static electricity and the like, the achievement of an anti-fuse element is made possible, which is less likely to cause insulation breakdown.

Because the capacitance unit has a protection function against electrostatic discharge in the anti-fuse element according to the present invention, an anti-fuse element can be provided which is less likely to cause insulation breakdown due to electrostatic discharge.

BRIEF EXPLANATION OF THE DRAWINGS

FIG. 7 is a graph showing characteristics of a conventional anti-fuse element.

DETAILED DESCRIPTION OF THE INVENTION

Modes for carrying out the present invention will be described below with reference to the accompanying drawings.

First Embodiment

Figure 1:
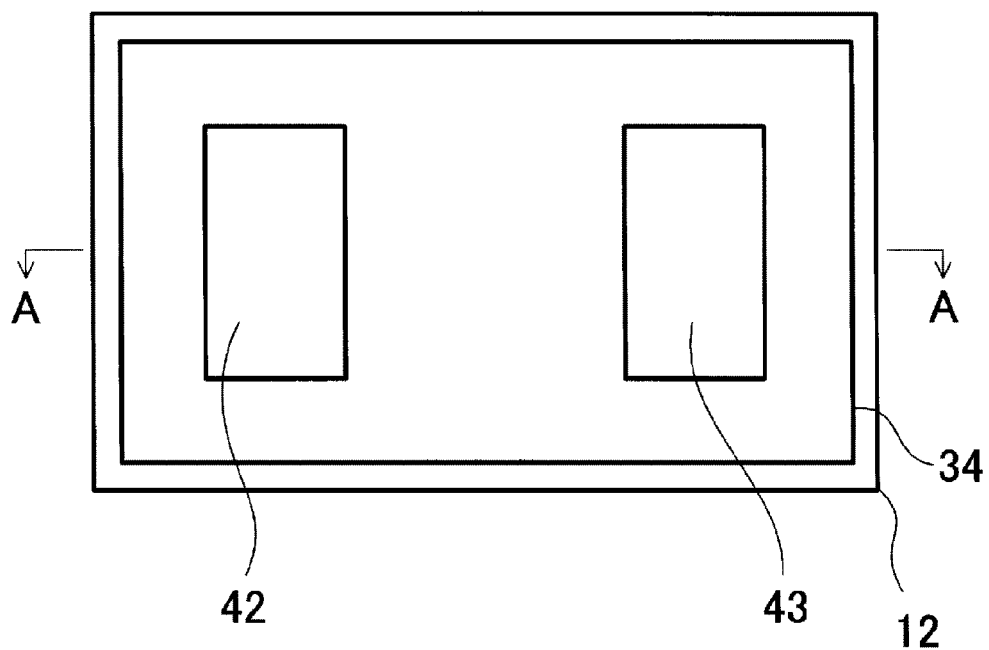
FIG. 1 is a plan view illustrating an anti-fuse element according to a first embodiment of the present invention.
Figure 2:
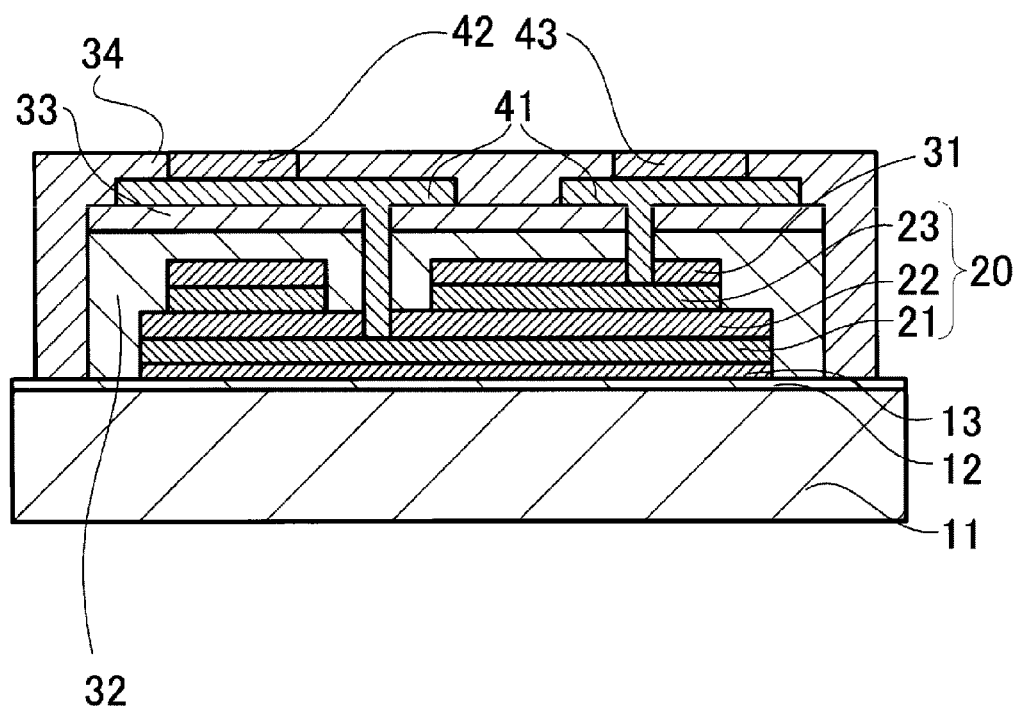
FIG. 2 is a cross-sectional view along line A-A of FIG. 1.

FIG. 1 is a plan view of an anti-fuse element according to a first embodiment of the present invention. Further, FIG. 2 is a cross-sectional view along the line A-A of FIG. 1.

For example, a Si single-crystalline substrate is selected for a substrate 11. Further, an oxide layer 12 is formed on the surface of the substrate 11. The oxide layer 12 is provided for the purpose of preventing interdiffusion between the substrate 11 and an adhesion layer 13. The oxide layer 12 is formed by, for example, subjecting the substrate 11 to a heat treatment.

Furthermore, the adhesion layer 13, a lower electrode layer 21, an insulation layer 22, and an upper electrode layer 23 are sequentially stacked on the oxide layer 12. Furthermore, a first inorganic protective layer 31 is formed on the upper electrode layer 23.

The adhesion layer 13 is formed to ensure the adhesion between the oxide layer 12 and the lower electrode layer 21. The adhesion layer 13 may use the same material as, or a different material from the insulation layer 22. The case of using the same material has the advantage of simplified production.

Conductive metallic materials are used for the lower electrode layer 21 and the upper electrode layer 23. To the anti-fuse element short-circuited, a current will be applied for a long period of time, and in that case, there is a need to prevent defects such as balls formed by oxidation. Therefore, it is preferable to use noble metals for the lower electrode layer 21 and the upper electrode layer 23. For example, the noble metals are preferably a metal or an alloy thereof including at least one element selected from the group consisting of gold, silver, platinum, palladium, rhodium, iridium, ruthenium, and osmium.

The lower electrode layer 21, the insulation layer 22, and the upper electrode layer 23 constitute a capacitance unit 20. The capacitance unit 20 preferably has a capacitance of 1 nF to 100 nF. In the case of the capacitance less than 1 nF, undesirably, a desired protection function is not achieved against electrostatic discharge. Alternatively, in the case of the capacitance greater than 100 nF, undesirably, the reaction time from the application of a voltage to short circuit is made longer excessively as the anti-fuse element.

Furthermore, the capacitance unit 20 further preferably has a capacitance of 4.2 to 15 nF, because the anti-fuse element has a withstand voltage within an optimum range in an electrostatic breakdown test.

For the insulation layer 22, such a material is selected that undergoes insulation breakdown to short-circuit the lower electrode layer 21 and the upper electrode layer 23 when the voltage applied between the lower electrode layer 21 and the upper electrode layer 23 is greater than a predetermined amount.

The insulation layer 22 preferably has a dielectric constant of 100 to 1000. This is because the dielectric constant within this range makes it possible to design the factors that influence the protection function against electrostatic discharge, such as the thickness and area of the insulation layer 22, within a preferable range.

In order to meet the requirement, examples of the material of the insulation layer 22 include $TiO_2$ with a dielectric constant on the order of 100, $(Ba,Sr)TiO_3$ with a dielectric constant on the order of 400, and a $Pb(Zr,Ti)O_3$ with a dielectric constant on the order of 1000.

The first inorganic protective layer 31 has a role to reduce the leakage current when a voltage is applied between the lower electrode layer 21 and the upper electrode layer 23. The first inorganic protective layer 31 may use the same material as, or a different material from the insulation layer 22. The case of using the same material has the advantage of simplified production.

The second inorganic protective layer 32 is formed to cover the adhesion layer 13, the capacitance unit 20, and the first inorganic protective layer 31. Examples of the material of the second inorganic protective layer 32 include $SiN_x$, $SiO_2$, $Al_2O_3$, and $TiO_2$.

The first organic protective layer 33 is formed on the second inorganic protective layer 32. Examples of the material of the first organic protective layer 33 include a polyimide resin and an epoxy resin.

A first external electrode 42 and a second external electrode 43 are formed so as to have their surfaces exposed at the upper surface of the anti-fuse element 10. The first external electrode 42 is electrically connected to the lower electrode layer 21 through an extraction electrode 41. In addition, the second external electrode 43 is electrically connected to the upper electrode layer 23 through an extraction electrode 41.

The second organic protective layer 34 is formed to cover the second inorganic protective layer 32, the first organic protective layer 33, and the extraction electrodes 41. Examples of the material of the second organic protective layer 34 include a polyimide resin and an epoxy resin.

The first organic protective layer 33 and the second organic protective layer 34 are formed so as to cover the inorganic protective layer 32. Thus, the first organic protective layer 33 and the second organic protective layer 34 can provide sealing, even when delamination is caused due to welding between the lower electrode layer 21 and the upper electrode layer 23. Therefore, a current can also be applied to the anti-fuse element in a stable manner after short circuit.

It is to be noted that while the insulation layer 22 has a one-layer structure in FIG. 2, the insulation layer 22 may have multiple layers present. In that case, each insulation layer and a pair of electrode layers present on and under the insulation layer will form each capacitance unit. In that case, the extraction electrode may be provided so that the electrode layers present on and under the multiple insulation layers are electrically are connected to the external electrodes. Depending on where the extraction electrode is formed, it is possible to connect the capacitance units derived from each insulation layer in parallel with each other.

FIGS. 3(a) to 3(d) are schematic diagrams illustrating a mechanism of the anti-fuse element according to the first embodiment of the present invention, in the case of changing from an insulating state to a conducting state.

Figure 3A:
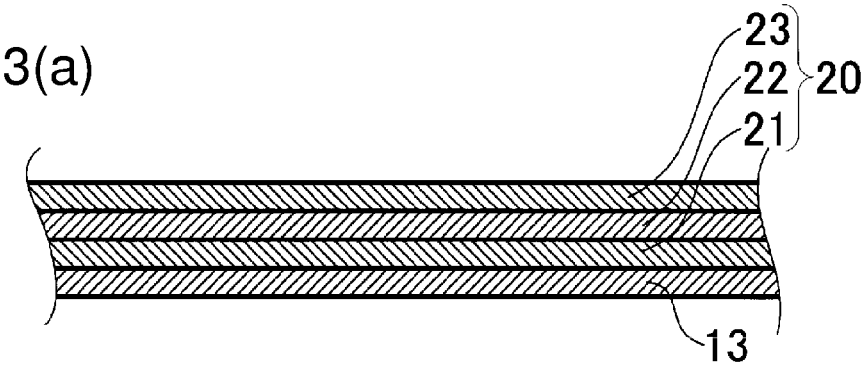
FIGS. 3(a) to 3(d) are schematic diagrams illustrating a mechanism of the anti-fuse element according to the first embodiment of the present invention, in the case of changing from an insulating state to a conducting state.

FIG. 3(a) is a diagram for the case of a normally operating electronic component such as an LED connected in parallel with the anti-fuse element. In this case, the lower electrode layer 21 and the upper electrode layer 23 are insulated from each other with the insulation layer 22 interposed therebetween.

However, when an electronic component such as an LED is brought into an open state due to disconnection or the like, a voltage not less than the breakdown voltage of the insulation layer 22 is applied to the anti-fuse element. Then, a high current to flow through the electronic component such as an LED, for example, of 10 mA or more, flows into the capacitance unit 20.

Figure 3B:
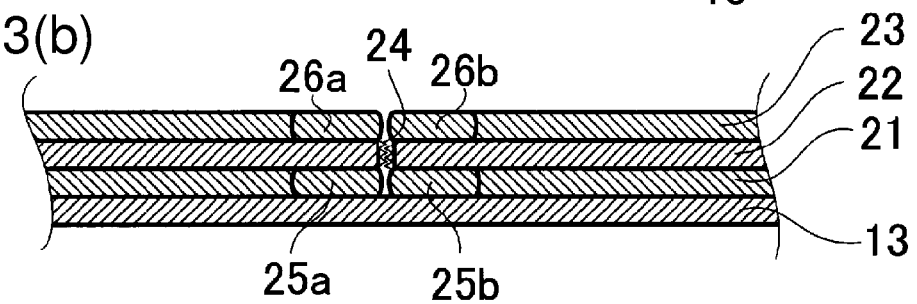

FIG. 3(b) is a diagram for a case in which a voltage not less than the breakdown voltage of the insulation layer 22 is applied to the anti-fuse element, thereby causing insulation breakdown. The current flowing into the capacitance unit 20 generates Joule heat. This heat generation melts the lower electrode layer 21 and the upper electrode layer 23 to form balls. For example, the lower electrode layer 21 is melted to form balls 25a, 25b. In addition, the upper electrode layer 23 is melted to form balls 26a, 26b. Then, the melting heat of the formed balls heats the insulation layer 22 to cause a crack 24 in the insulation layer 22.

Figure 3C:
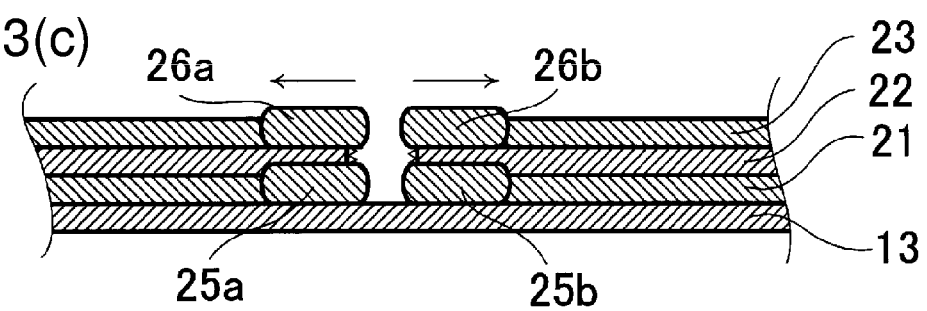

FIG. 3(c) is a diagram for a case of the progressively melted lower electrode layer 21 and upper electrode layer 23. Because a current continues to flow into the capacitance unit 20, the lower electrode layer 21 and the upper electrode layer 23 are melted progressively with the passage of time. The formed balls 25a, 25b, 26a, 26b are swollen in the direction of an arrow. Then, the insulation layer 22 is completely divided by melting heat.

Figure 3D:
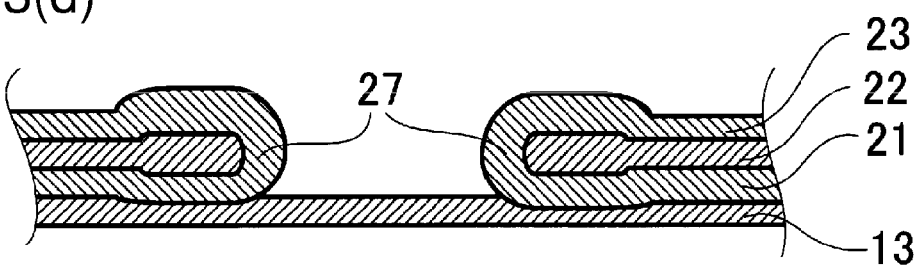

FIG. 3(d) is a diagram of a further melted state. When the formed balls 25a, 25b, 26a, 26b are swollen progressively, the swollen balls are integrated by welding with each other in a manner that wraps the divided insulation layer 22. Then, a joint 27 is formed to provide a conducting state. In the conducting state, the heat generated by applying a current is reduced to lower the temperature, and thus lower the resistance. Therefore, a high current will flow through the anti-fuse element.

Figure 6:
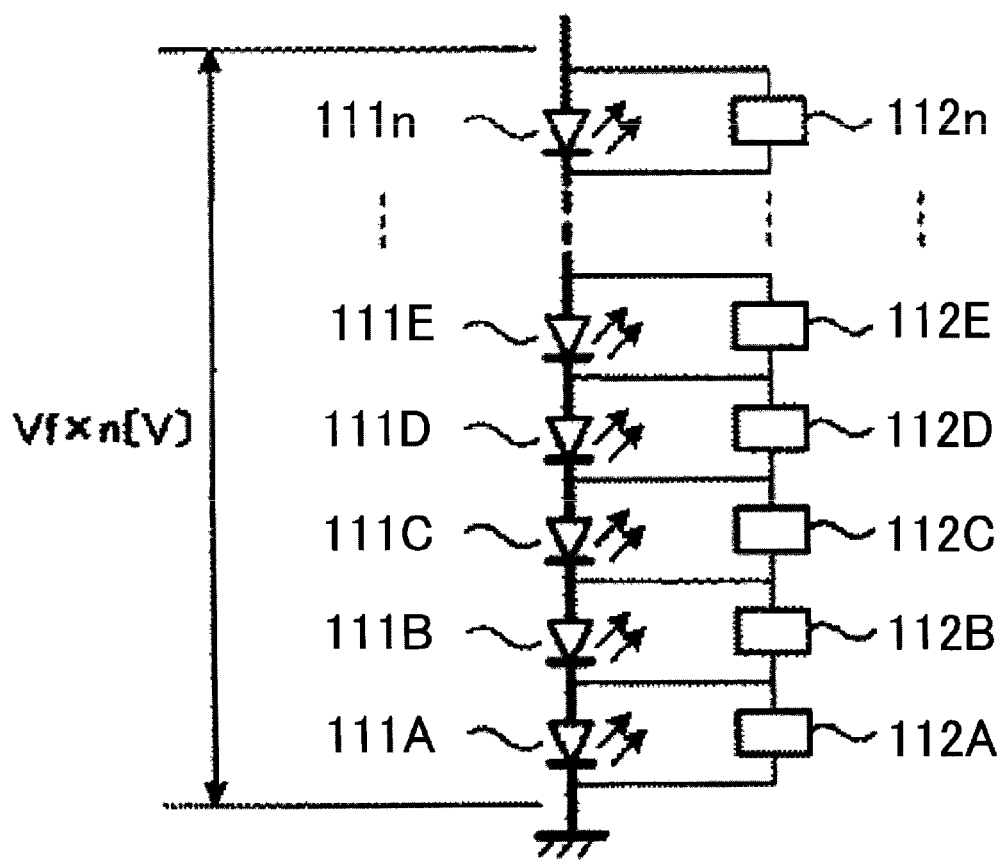
FIG. 6 is an electrical circuit diagram of a conventional anti-fuse element.

A case will be considered which uses the anti-fuse element according to the present invention in a circuit as in FIG. 6. More specifically, for example, when the LED 111A is brought into defective open to put the light out, the lower electrode layer and upper electrode layer of the anti-fuse element 112A connected in parallel with the LED 111A are short-circuited by welding with each other through the mechanism described above, to bring the anti-fuse element 112A from the insulating state to a conducting state. Then, a current flows into the anti-fuse element 112A around the LED 111A. Thus, the other LEDs connected in series with the LED 111A will be kept in the conducting state to continue to light up.

While the case of the anti-fuse element connected to LEDs has been described in the present embodiment, the electronic components connected to the anti-fuse element are not limited to LEDs. The use of the anti-fuse element according to the present invention allows, even when some of electronic components connected in series with each other break down into an open state, the other electronic components to continue to operate normally. Moreover, when the electrode layers formed from a high-melting-point noble metal material made of Pt or Au are short-circuited by melting and welding with each other, the low resistance can be maintained without any oxidation or increase in resistance even due to the melting. Accordingly, a power source which is large in power capacity is also not required.

Experimental Example

In this experimental example, four types of anti-fuse elements were prepared by varying the capacitance. First, the anti-fuse element under condition 1 was prepared as follows. The anti-fuse element under condition 1 has the structure as in FIG. 2.

First of all, an Si single crystalline substrate (hereinafter, an "Si substrate") was prepared on which an oxide layer of 700 nm in thickness was formed.

Next, a barium strontium titanate ((Ba,Sr)TiO$_3$, hereinafter referred to as a "BST") layer was formed as an adhesion layer. Specifically, a raw material solution of a Ba organic compound, a Sr organic compound, and a Ti organic compound mixed so as to have a ratio of Ba:Sr:Ti=70:30:100 (molar ratio) was applied by spin coating onto the upper surface of the Si substrate, and dried at a temperature of 300° C. on a hot plate. After this was repeated twice, an RTA (Rapid Thermal Annealing) treatment was carried out at a rate of temperature increase of 5° C./s, to carry out a heat treatment for 30 minutes under a condition of 600° C. in an oxygen atmosphere. In this way, a BST layer of 90 nm in thickness was formed.

Next, as the lower electrode layer, a Pt layer of 200 nm in thickness was formed on the adhesion layer by using a sputtering method.

Next, the insulation layer, the upper electrode layer, and the first inorganic protective layer were formed sequentially. More specifically, a BST layer of 90 nm in thickness was formed as the insulation layer on the Pt layer by the same method as in the case of the BST layer described previously. On this BST layer, a Pt layer of 200 nm in thickness was formed as the upper electrode layer 23 by the same method as in the case of the Pt layer described previously. Furthermore, on this Pt layer, a BST layer of 90 nm in thickness was formed as the first inorganic protective layer.

Next, the first inorganic protective layer and the upper electrode layer were subjected to patterning. More specifically, a resist was applied onto the BST layer to serve as the first inorganic protective layer, and subjected to exposure and development to form a resist pattern. Then, patterning into a predetermined shape was carried out by RIE (Reactive Ion Etching), and the resist was then removed by ashing. The insulation layer, the lower electrode layer, and the adhesion layer were subjected to patterning by the same method, and the resist was then removed.

Next, the second inorganic protective layer and the first organic protective layer were formed as follows, so as to cover the upper surfaces and side surfaces of the patterned first inorganic protective layer, upper electrode layer, insulation layer, lower electrode layer, and adhesion layer. More specifically, a $SiN_x$ layer of 400 nm in thickness was formed by sputtering as the second inorganic protective layer. A photosensitive polyimide was applied thereon by spin coating as the first organic protective layer. Then, the photosensitive polyimide was subjected to exposure, development, and curing to form a mask pattern of polyimide resin. The $SiN_x$ layer and the BST layer were subjected to patterning by RIE with the use of the mask pattern so as to form an opening.

Next, the extraction electrode was formed. Specifically, a Ti layer (layer thickness: 50 nm) and a Cu layer (layer thickness: 500 nm) were continuously formed with the use of magnetron sputtering.

Next, the extraction electrode was subjected to patterning. Specifically, a resist pattern was formed by sequentially carrying out the application, exposure, and development of a resist. Then, the Cu layer was subjected to patterning by wet etching with the resist pattern as a mask. Subsequently, the Ti layer was subjected to patterning by RIE with the use of the resist pattern as it was.

Next, the first external electrode and the second external electrode were formed. Specifically, a resist pattern was formed by sequentially carrying out the application, exposure, and development of a resist. Then, a Ni layer of 1 μm in thickness was formed by electrolytic plating in the opening of the resist pattern. An Au layer of 1 μm in thickness was formed thereon.

Next, a polyimide resin layer was formed as the second organic protective layer around the first external electrode and the second external electrode. Specifically, a photosensitive polyimide was applied by spin coating as a solder resist, and sequentially subjected to exposure, development, and curing to form a patterned photosensitive polyimide.

Then, the substrate was cut to clip an anti-fuse element. Specifically, the principal surface of the Si substrate with no capacitance unit formed was subjected to grinding until the thickness of the Si substrate was 0.1 mm. Then, the substrate was cut with the use of a dicing saw to clip an anti-fuse element in a chip form of predetermined size. In this way, the anti-fuse element under condition 1 was obtained. The anti-fuse element under condition 1 had a size of L 1.0×W 0.5×T 0.5 mm, and an effective electrode area of 0.385 $mm^2$. In addition, the capacitance was 15 nF.

Next, the anti-fuse element under condition 2 was prepared. The anti-fuse element under condition 2 has a structure with four electrode layers and three insulation layers formed alternately. Furthermore, capacitance units derived from each insulation layer were connected in parallel with each other in the structure to increase the capacitance. The thickness per insulation layer and the thickness per electrode layer were adjusted to the same thicknesses as under condition 1. In addition, the other preparation conditions were made the same as condition 1. The anti-fuse element under condition 2 had a size of 0.6×0.3×0.3 mm, and an effective electrode area of 0.256 $mm^2$. In addition, the capacitance was 10 nF.

Next, the anti-fuse element under condition 3 was prepared. The anti-fuse element under condition 3 is different in size and capacitance from that under condition 1. The other preparation conditions were made the same as condition 1. The anti-fuse element under condition 3 had a size of 0.6× 0.3×0.3 mm, and an effective electrode area of 0.108 $mm^2$. In addition, the capacitance was 4.2 nF.

Next, the anti-fuse element under condition 4 was prepared as a comparative example. Unlike the BST (dielectric constant: 400) under conditions 1 to 3, $SiN_x$ (dielectric constant: 7) was used for the insulation layer of the anti-fuse element under condition 4. Further, the thickness of the insulation layer was adjusted to 75 nm under condition 4. In addition, ECR sputtering was used for the formation of the $SiN_x$ layer to serve as the insulation layer. The other preparation conditions were made the same as condition 1. The anti-fuse element under condition 4 had a size of 1.0×0.5×0.5 mm, and an effective electrode area of 0.385 $mm^2$. In addition, the capacitance was 0.26 nF.

The following measurements were made for the obtained samples under the respective conditions.

First, the breakdown voltage (BDV) was found from the measurement result of voltage-current (V-I) characteristics. The maximum of the BDV value was adopted while the number of measurements was 20.

Next, the withstand voltage was obtained in an electrostatic breakdown test for a machine model. The machine model refers to a model which discharges when the charge of a charged metallic device is brought into contact with the element, which is intended to introduce a pulsed current to the element. The test method was supposed to conform to EIA-JED-4701/304. The number of measurements was 20, and the test was carried out 5 times for each varied polarity. The electrostatic breakdown test was started from 50 V, and when resistance degradation by one or more orders of magnitude was not observed for the sample, the test voltage was increased by 50 V to repeat the test. The maximum value of the test voltage at which resistance degradation by one or more orders of magnitude was not observed was regarded as the withstand voltage. The higher withstand voltage indicates the higher resistance to electrostatic discharge.

Figure 4:
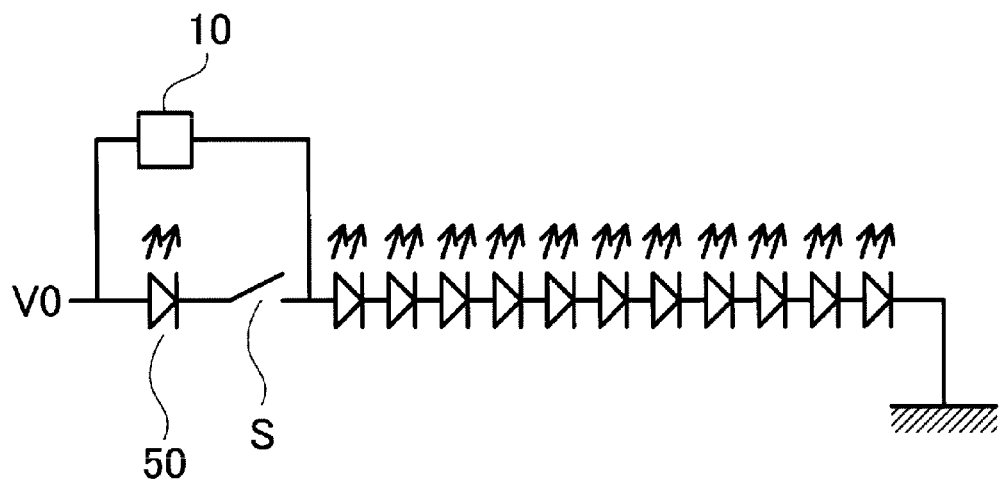
FIG. 4 is an electrical circuit diagram of a module using an anti-fuse element prepared in an experimental example.
Figure 5:
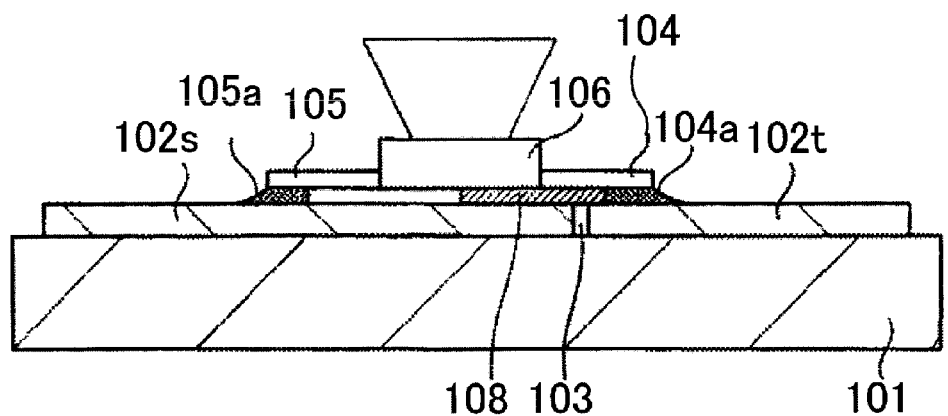
FIG. 5 is a cross-sectional view illustrating a conventional anti-fuse element.

Next, it was confirmed whether or not the anti-fuse elements were short-circuited. Specifically, a module was prepared with twelve 1 W white LEDs 50 connected in series as shown in FIG. 4. Then, a switch (denoted by S in the figure) was provided in a position among the twelve LEDs 50, and an anti-fuse element 10 was connected with solder in parallel with the switch and the LED 50. With the switch closed, a current of 300 mA was applied with the use of a constant-current power supply. The voltage was approximately 40 V during the application of 300 mA. In this condition, the switch was opened to confirm whether or not the anti-fuse element 10 was short-circuited. It is to be noted that the voltage of the constant-current power supply had an upper limit set to 48 V.

Table 1 shows the experimental condition and the results.

TABLE 1

| No. | Size of anti-fuse element [mm] | Effective electrode area [mm²] | Capacitance [nF] | Breakdown voltage [V] | Withstand voltage in electrostatic breakdown test [V] | Presence of short-circuit |
|---|---|---|---|---|---|---|
| Condition 1 | 1 × 0.5 × 0.5 | 0.385 | 15 | 18 | 250 | ◯ |
| Condition 2 | 0.6 × 0.3 × 0.3 | 0.256 | 10 | 18 | 200 | ◯ |
| Condition 3 | 0.6 × 0.3 × 0.3 | 0.108 | 4.2 | 19 | 100 | ◯ |
| Condition 4* | 1 × 0.5 × 0.5 | 0.385 | 0.26 | 30 | 50 | X |

Condition 4 is outside the scope of the present invention

From Table 1, condition 4 using $SiN_x$ for the insulation layer resulted in a high breakdown voltage of 30 V. On the other hand, conditions 1, 2, and 3 using BST for the insulation layers succeeded in suppressing the breakdown voltage to 18 to 19 V. The lower breakdown voltage can lower the applied voltage, which is thus advantageous, in particular, in the case of protecting a plurality of electronic components connected in series with each other.

In addition, in the case of condition 4 with low capacitance, the withstand voltage in the electrostatic breakdown test was low and 50 V. On the other hand, conditions 1 to 3 using BST for the insulation layers succeeded in achieving a capacitance of 1 nF or more, and also resulted in a high withstand voltage of 100 V to 250 V in the electrostatic breakdown test. More specifically, it is determined that in the case of conditions 1 to 3, the resistance to electrostatic discharge is high because of the high withstand voltages in the electrostatic breakdown test assuming electrostatic discharge.

In addition, in the case of conditions 1 to 3, the anti-fuse elements were brought into short circuit conditions within one second after opening the switch, and the other LEDs thereby lighted up. The current in this case was 300 mA for all of the samples, with the voltage in the range of 36.7 to 37.0 V. On the other hand, in the case of condition 4, no short circuit condition was produced even when the switch was opened, because of the high breakdown voltage.

DESCRIPTION OF REFERENCE SYMBOLS

10: anti-fuse element
11: substrate
12: oxide layer
13: adhesion layer
20: capacitance unit
21: lower electrode layer
22: insulation layer
23: upper electrode layer
24: crack
25a, 25b, 26a, 26b: ball
27: joint
31: first inorganic protective layer
32: second inorganic protective layer
33: first organic protective layer
34: second organic protective layer
41: extraction electrode
42: first external electrode
43: second external electrode
50: LED
101: substrate
102s, 102t: wiring pattern
103: gap
104, 105: lead terminal
104a, 105a: solder
106: LED
108: insulation layer
111: LED
112: anti-fuse element

The invention claimed is:

1. An anti-fuse element comprising:
a capacitance unit including an insulation layer and at least a pair of electrode layers on opposed first and second surfaces of the insulation layer, wherein
the capacitance unit has a capacitance of 1 nF to 100 nF,
the capacitance unit is configured to have a protection function against electrostatic discharge, and
during the application of a voltage not less than a breakdown voltage of the insulation layer, at least the pair of electrode layers are melted, and at least the pair of electrode layers are electrically connected by welding to each other.

2. The anti-fuse element according to claim 1, wherein the capacitance unit has a withstand voltage of 100 V to 250 V.

3. The anti-fuse element according to claim 1, wherein the insulation layer has a dielectric constant of 100 to 1000.

4. The anti-fuse element according to claim 1, wherein the capacitance unit has a capacitance of 4.2 nF to 15 nF.

5. The anti-fuse element according to claim 4, wherein the insulation layer has a dielectric constant of 100 to 1000.

6. The anti-fuse element according to claim 1, wherein the insulation layer has a dielectric constant of 100 to 1000.

7. The anti-fuse element according to claim 1, wherein during the application of the voltage not less than the breakdown voltage of the insulation layer, at least the pair of electrode layers are melted to divide the insulation layer, and weld at least the pair of electrode layers with each other in a manner that wraps the insulation layer therearound.

8. The anti-fuse element according to claim 1, wherein the insulation layer is a material of $(Ba,Sr)TiO_3$, and at least the pair of electrode layers are a material of a metal or an alloy thereof including at least one element selected from the group consisting of gold, silver, platinum, palladium, rhodium, iridium, ruthenium, and osmium.

9. The anti-fuse element according to claim 1, wherein the pair of electrodes include a noble metal.

10. The anti-fuse element according to claim 1, wherein a material of the insulation layer is selected from the group consisting of $TiO_2$, $(Ba,Sr)TiO_3$, and $Pb(Zr,Ti)O_3$.

11. The anti-fuse element according to claim 1, further comprising a first inorganic protective layer on a first electrode layer of the pair of electrode layers.

12. The anti-fuse element according to claim 11, further comprising a second inorganic protective layer covering the first inorganic protective layer and the capacitance unit.

13. The anti-fuse element according to claim 12, further comprising a first organic protective layer on the second inorganic protective layer.

14. The anti-fuse element according to claim 13, further comprising a first extraction electrode electrically connected to the first electrode layer of the pair of electrode layers, and a second extraction electrode electrically connected a second electrode layer the pair of electrode layers.

15. An anti-fuse element comprising
a capacitance unit including an insulation layer and at least a pair of electrode layers on opposed first and second surfaces of the insulation layer, wherein the capacitance unit is configured to have a protection function against electrostatic discharge;
a first inorganic protective layer on a first electrode layer of the pair of electrode layers;
a second inorganic protective layer covering the first inorganic protective layer and the capacitance unit;
a first organic protective layer on the second inorganic protective layer;
a first extraction electrode electrically connected to the first electrode layer of the pair of electrode layers, and a second extraction electrode electrically connected a second electrode layer the pair of electrode layers; and
a second organic protective layer covering at least part of the second inorganic protective layer, the first organic protective layer the first extraction electrode and the second extraction electrode.

16. The anti-fuse element according to claim 15, further comprising a first external electrode electrically connected to the first extraction electrode and exposed through the second organic protective layer; and a second external electrode electrically connected to the second extraction electrode and exposed through the second organic protective layer.

* * * * *